United States Patent [19]

Ikeda et al.

[11] Patent Number: 5,448,415
[45] Date of Patent: Sep. 5, 1995

[54] DEVICE FOR EMITTING LIGHT DIVERGING ALONG IMAGINARY PLANE

[75] Inventors: Hirofumi Ikeda, Tokyo; Yoshiyuki Iwashita, Chiba, both of Japan

[73] Assignee: Kabushiki Kaisha Machida Seisakusho, Tokyo, Japan

[21] Appl. No.: 782,301

[22] Filed: Oct. 24, 1991

[30] Foreign Application Priority Data

Nov. 1, 1990 [JP] Japan .................. 2-293674

[51] Int. Cl.⁶ ............................................ B29D 11/00
[52] U.S. Cl. ................... 359/710; 359/708; 359/726
[58] Field of Search ............... 359/708, 710, 726, 720, 359/727, 728, 641; 356/136, 153, 445

[56] References Cited

U.S. PATENT DOCUMENTS 4,963,021 10/1990 Nakamura et al. ................... 359/726

FOREIGN PATENT DOCUMENTS 53-133048 11/1978 Japan .
61-179528 11/1986 Japan .

Primary Examiner—Bruce Y. Arnold
Assistant Examiner—Hung Xuan Dang
Attorney, Agent, or Firm—Fish & Richardson

[57] ABSTRACT

There is disclosed a device for emitting light diverging along an imaginary plane. This device includes a light source, a collimating lens, and a cylindrical optical element which are mounted within a casing. A reflecting surface, inclined with respect to an axis of the optical element, and a cylindrical surface extending along the axis of the optical element are formed on one end portion of the optical element disposed near one end portion of the casing. That portion of the optical element including this cylindrical surface serves as a cylindrical lens portion. The beam from the collimating lens advances along the axis of the optical element, and is reflected by the reflection surface to be directed toward the cylindrical lens portion. This reflected beam is converted by the cylindrical lens portion into a beam diverging along the imaginary plane disposed generally perpendicular to the axis of the optical element, and is emitted from the casing.

11 Claims, 3 Drawing Sheets

DEVICE FOR EMITTING LIGHT DIVERGING ALONG IMAGINARY PLANE

BACKGROUND OF THE INVENTION

This invention relates to a device for emitting light diverging along an imaginary plane.

Japanese Laid-Open Patent Application No. 53-133048 and Japanese Laid-Open Utility Model Application No. 61-179528 discloses devices for emitting light diverging along an imaginary plane. More specifically, this light emitting device comprises a light source, a convex lens and a cylindrical lens which are disposed on a common straight line. The light source emits light diverging along an optical axis. The convex lens converges the light, fed from the light source, so as to focus this light on a spot spaced apart from the convex lens. The axis of the cylindrical lens is disposed perpendicular to the optical axis of the convex lens. The cylindrical lens converts the light, fed from the convex lens, into light diverging along an imaginary plane disposed perpendicular to the axis of the cylindrical lens. The light from the cylindrical lens reaches an object to be inspected (this object intersects the imaginary plane), and appears as a line on the object to be inspected. By observing this line at an inspection position, the shape of the object to be inspected can be recognized.

In some cases, it is required to emit light which diverges along an imaginary plane parallel to a flat surface, and besides sometimes, it is required that the spacing between the imaginary plane and the flat surface should be as small as possible. The above conventional light emitting devices can not meet these requirements. More specifically, the light source, the convex lens and the cylindrical lens must be contained or housed in a casing, though this is not described in the above publications. Therefore, the minimum value of the above spacing is determined by the sum of the diameter of the convex lens (or the light source) and the thickness of the peripheral wall of the casing surrounding the convex lens and the light source. Thus, to narrow the spacing is limited.

SUMMARY OF THE INVENTION

It is an object of this invention to provide a device which can emit light diverging along an imaginary plane spaced closely from a flat surface, and is simple in construction.

According to one aspect of the present invention, there is provided a device for emitting light diverging along an imaginary plane, comprising:

(a) a casing:
(b) a light source mounted within the casing;
(c) collimating lens means mounted within the casing so as to convert light from the light source into a generally parallel beam; and
(d) a transparent optical element of a generally cylindrical shape mounted within the casing, the optical element having a reflection surface and an cylindrical surface at one end portion thereof disposed near one end of the casing, the reflection surface being inclined with respect to an axis of the optical element, the cylindrical surface extending along the axis of the optical element, that portion of the optical element including the cylindrical surface serving as a cylindrical lens portion, wherein the beam from the collimating lens means advances along the axis of the optical element, and is reflected by the reflecting surface to be directed toward the cylindrical lens portion, and the reflected beam is converted by the cylindrical lens portion into a beam diverging along the imaginary plane disposed generally perpendicular to the axis of the optical element, and is emitted from the casing.

According to another aspect of the invention, there is provided a device for emitting light diverging along an imaginary plane, comprising:

(a) a casing:
(b) light emitting means mounted within the casing for emitting a generally parallel beam; and
(c) a transparent optical element of a generally cylindrical shape mounted within the casing, the optical element having a reflection surface and an cylindrical surface at one end portion thereof disposed near one end of the casing, the reflection surface being inclined with respect to an axis of the optical element, the cylindrical surface extending along the axis of the optical element, that portion of the optical element including the cylindrical surface serving as a cylindrical lens portion, wherein the beam from the light emitting means advances along the axis of the optical element, and is reflected by the reflecting surface to be directed toward the cylindrical lens portion, and the reflected beam is converted by the cylindrical lens portion into a beam diverging along the imaginary plane disposed generally perpendicular to the axis of the optical element, and is emitted from the casing.

DESCRIPTION OF THE PREFERRED EMBODIMENTS

Figure 1:
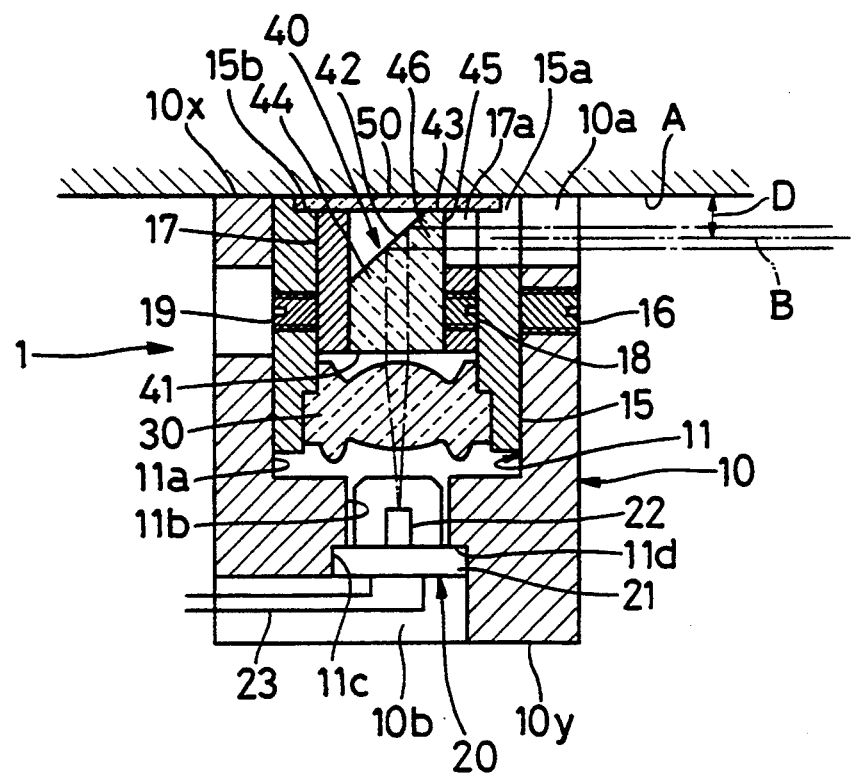
FIG. 1 is a vertical cross-sectional view of a light emitting device according to the present invention.

A preferred embodiment of the present invention will now be described with reference to the drawings. As shown in FIG. 1, a light emitting device 1 comprises a cylindrical casing 10. Flat surfaces 10x and 10y perpendicular to the axis of the casing 10 are formed on the opposite ends (upper and lower ends in FIG. 1) of the casing 10, respectively. The casing 10 has a stepped through hole 11 extending axially through the casing 10. The through hole 11 has a first hole portion 11a of a larger diameter, a second hole portion 11b of a smaller diameter, and a third hole portion 11c of an intermediate diameter which are disposed in this order from the upper end of the casing 10. A window 10a is formed in the upper end of the casing 10, and extends radially right through the peripheral wall of the casing 10. A recess 10b is formed in the lower end of the casing 10, and extends radially left from the third hole portion 11c through the peripheral wall of the casing 10.

A semiconductor laser element (light source) 20, a collimating lens 30 and an optical element 40 are mounted within the casing 10, and are arranged in this order from the lower end of the casing 10.

The semiconductor laser element 20 has a flange 21, and this flange 21 is fixed to a shoulder or step 11d between the second hole portion 11b and the third hole portion 11c. A light emitting portion 22 of the semiconductor laser element 20 is received in the second hole portion 11b. Lead wires 23 of the semiconductor laser element 20 are led to the exterior of the casing 10 through the recess 10b in the casing 10. The light emitting portion 22 of the semiconductor laser element 20 emits a laser beam along an optical axis aligned with the axis of the casing 10. This laser beam diverges into a conical shape progressively upward.

The collimating lens 30 is supported on the casing 10 through a first support tube 15. More specifically, the collimating lens 30 is fixed to the lower end portion of the first support tube 15. The first support tube 15 is received in the first hole portion 11a of the casing 10, and is fixed to the casing 10 by a fixing screw 16. The fixing screw 16 is threaded through the peripheral wall of the casing 10, and is firmly held at its distal end against the outer peripheral surface of the first support tube 15. The upper end of the first support tube 15 lies flush with the upper end of the casing 10. The collimating lens 30 is disposed in opposed relation to the semiconductor laser element 20, and the optical axis of the collimating lens 30 is aligned with the axis of the casing 10. The light emitting portion 22 of the semiconductor laser element 20 is disposed at the focal position of the collimating lens 30.

Figure 3:
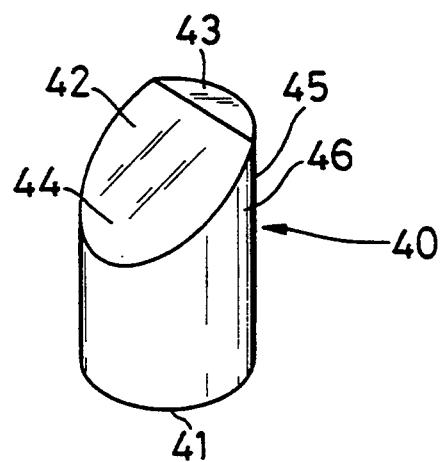
FIG. 3 is a perspective view of an optical element used in the light emitting device.

The optical element 40 is made of a transparent material such as glass and a plastics material, and has a generally cylindrical shape, as best shown in FIG. 3. The optical element 40 is supported on the casing 10 through a second support tube 17 and the first support tube 15. More specifically, the optical element 40 is received in the second support tube 17, and is fixed thereto by a fixing screw 18. The fixing screw 18 is threaded through the peripheral wall of the second support tube 17, and is firmly held at its distal end against the outer peripheral surface of the optical element 40. The second support tube 17 is received in the first support tube 15, and fixed thereto by a fixing screw 19. The fixing screw 19 is threaded through the peripheral wall of the first support tube 15, and is firmly held at its distal end against the outer peripheral surface of the second support tube 17.

The axis of the optical element 40 is aligned with the axis of the casing 10, and hence is aligned with the optical axes of the semiconductor laser element 20 and the collimating lens 30. The lower end surface of the optical element 40 defines a light receiving surface 41 which is flat and is perpendicular to the axis of the optical element 40. The light receiving surface 41 is disposed in opposed relation to the collimating lens 30. A reflection surface 42 is formed on the upper end portion of the optical element 40, and is inclined at an angle of 45° with respect to the axis of the optical element 40. The upper end of the reflection surface 42 is cut away to provide a flat surface 43 disposed perpendicular to the axis of the optical element 40. That portion of the optical element 40 including the reflection surface 42 serves as a prism portion 44. That portion of the upper end portion of the optical element 40 including a cylindrical surface 45 facing away from the reflection surface 42 serves as a cylindrical lens portion 46. In FIG. 1, the reflection surface 42 of the prism portion 44 is disposed on the left side, and the cylindrical surface 45 of the cylindrical lens portion 46 is disposed on the right side.

An annular notch 15b is formed in the upper end surface of the first support tube 15 at its inner peripheral portion. A transparent cover 50 of a circular shape is fixed at its peripheral edge portion to the notch 15b. The upper end of the second support tube 17 and the flat surface 43 of the optical element 40 lie flush with the bottom surface of the notch 15b, and are held in contact with the lower surface of the cover 50.

Figure 2:
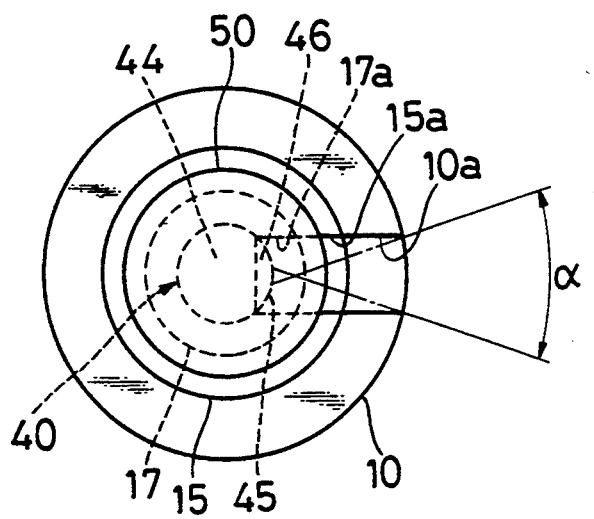
FIG. 2 is a plan view of the light emitting device.

Windows 15a and 17a are formed respectively in the upper ends of the first and second support tubes 15 and 17 at the right side thereof. These windows 15a and 17a are equal in the circumferential width and the depth to the window 10a of the casing 10. As shown in FIG. 2, the windows 10a, 15a and 17a are disposed at the same angular position, and hence are disposed in registry with one another in opposed relation to the cylindrical lens portion 46 of the optical element 40.

Figure 4:
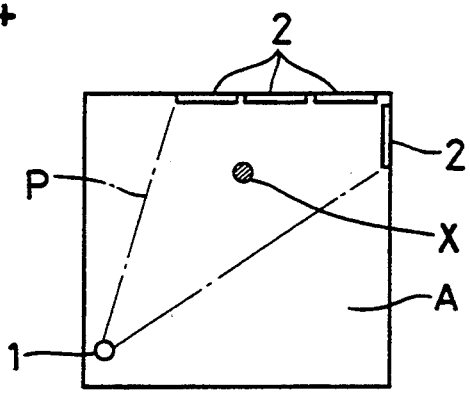
FIG. 4 is a schematic view of a monitoring system using the light emitting device.

The light emitting device 1 of the above construction is used, for example, in a monitoring system. More specifically, as shown in FIGS. 1 and 4, the light emitting device 1 is disposed with its end surface 10x held in contact with a flat surface A, for example, of a plate. A plurality of light receiving elements 2 are disposed on or near the surface A in spaced relation to the light emitting device 1.

The laser beam of a conical shape emitted from the semiconductor laser element 20 is converted by the collimating lens 30 into a parallel beam. The parallel beam from the collimating lens 30 is incident on the light receiving surface 41 of the optical element 40, and advances upward along the axis of the optical element 40, and is perpendicularly (right-angularly) reflected by the reflection surface 42 of the optical element 40. The reflected beam passes through the cylindrical lens portion 46, and is refracted by its cylindrical surface 45. As best shown in FIG. 2, the refracted beam converges into a point near the cylindrical surface 45, and then diverges into a fan-shape along an imaginary plane B (FIG. 1), and is emitted from the casing 10 through the windows 17a, 15a and 10a. The imaginary plane B is parallel to the surface A of the plate. The angle $\alpha$ of divergence of the beam (FIG. 2) is limited by the width of the window 10a of the casing 10.

As shown in FIG. 4, when an intruding object X approaches the surface A, part of the diverging beam P from the light emitting device 1 is intercepted by the intruding object X. Therefore, the amount of reception of the light by the light receiving element 2 disposed on a straight line interconnecting the light emitting device 1 and the intruding object X is decreased, and therefore the intruding object X can be detected.

In the above light emitting device 1, the distance D between the imaginary plane B (along which the beam is disposed) and the surface A is determined irrespective of the diameter of the collimating lens 30 and the thickness of the peripheral wall of the casing 10. Namely, the distance D is equal to the distance between the end surface 10x of the casing 10 and the point of intersection between the reflection surface 42 and the axis of the optical element 40. Since the reflection surface 42 as well as the cylindrical lens portion 46 is disposed near the end surface 10x, the distance D can be made small. Therefore, it is difficult for the intruding object X to intrude without being detected at the space between the surface A and the imaginary plane B.

Further, since the optical element 40 of a cylindrical shape has the prism portion 44 for reflecting the light, and the cylindrical lens portion 46 for diverging the light into a fan-shape, the number of the component parts is reduced, and therefore the light emitting device 1 can be of a compact size. Further, the positioning of the prism portion 44 and the cylindrical lens portion 46 relative to each other does not need to be performed. Further, since the optical element 40 is of a cylindrical shape, the axis of the optical element 40 can be easily aligned with the optical axes of the semiconductor laser element 20 and the collimating lens 30.

Next, the other embodiments of the present invention will now be described. Those parts of each of the other embodiments corresponding to those of the preceding embodiment of FIG. 1 are designated by identical reference numerals, respectively, and detailed explanation thereof will be omitted.

Figure 5:
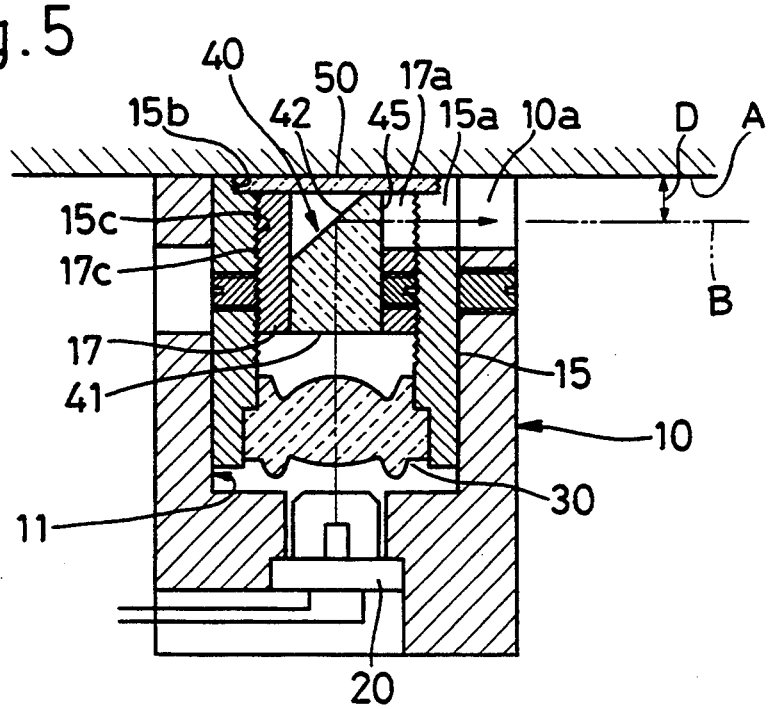
FIGS. 5 to 7 are views similar to FIG. 1, but showing modified light emitting devices, respectively.

In a light emitting device shown in FIG. 5, an internally-threaded portion 15c is formed on an inner peripheral surface of a first support tube 15 serving as part of a casing 10, and an externally-threaded portion 17c threadedly engaged with the internally-threaded portion 15c is formed on an outer peripheral surface of a second support tube 17. When the second support tube 17 is rotated clockwise, for example, through 360°, an optical element 40 is moved upward in an amount corresponding to one pitch of the thread, and when the second support tube 17 is rotated counterclockwise through 360°, the optical element 40 is moved downward in the same amount. With this arrangement, the distance D between an imaginary plane B (along which the laser beam from the light emitting device is disposed) and a surface A can be adjusted. A cover 50 is threaded into a notch 15b formed in the first support tube 15.

Figure 6:
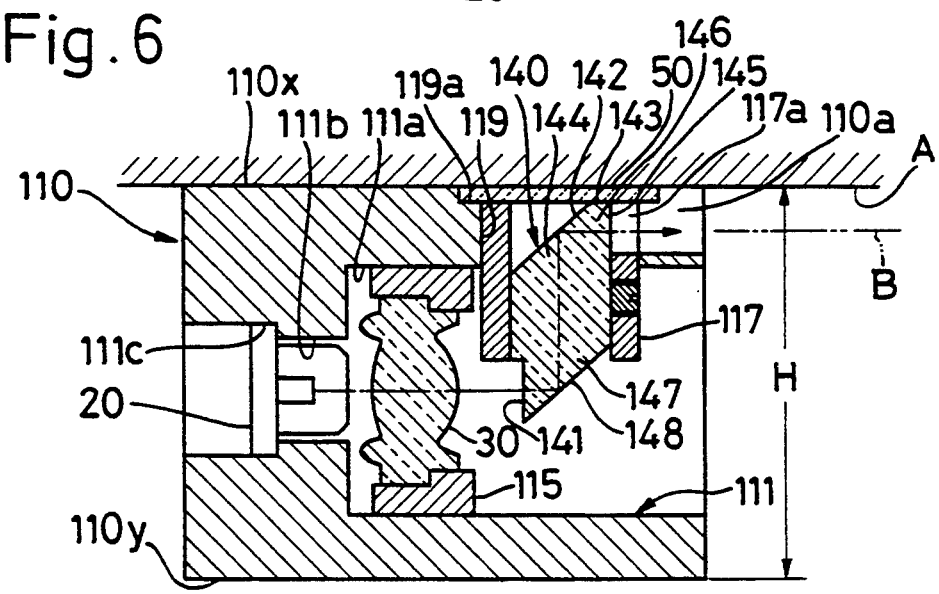

In an embodiment shown in FIG. 6, a casing 110 of a generally cylindrical shape is extended in right and left directions in FIG. 6. Flat surfaces 110x and 110y are formed on the upper and lower ends of the casing 110, respectively. The upper flat surface 110x is held in contact with a flat surface A. The casing 110 has a through hole 111 extending axially therethrough. The through hole 111 has a first hole portion 111a of a larger diameter, a second hole portion 111b of a smaller diameter, and a third hole portion 111c of an intermediate diameter which are arranged in this order from the right side of the casing 110. A semiconductor laser element 20 is received in the second hole portion 111b. A collimating lens 30 is mounted in the left end portion of the first hole portion 111a through a first support tube 115. The optical axes of the semiconductor laser element 20 and the collimating lens 30 are aligned with the axis of the through hole 111.

An auxiliary through hole 119 is formed through that portion of the peripheral wall of the casing 110 disposed on the right side of the collimating lens 30, the auxiliary through hole 119 being disposed perpendicular to the through hole 111. An optical element 140 is mounted in the auxiliary through hole 119 through a second support tube 117. This optical element 140 has a generally cylindrical shape as described above for the optical element 40 of FIG. 1, and has at its upper end portion a prism portion 144 having a reflection surface 142, a cylindrical lens portion 146 having a cylindrical surface 145, and a flat surface 143.

The axis of the optical element 140 is disposed perpendicular to the optical axes of the semiconductor laser element 20 and the collimating lens 30. The lower end portion of the optical element 140 is different in shape from that of the optical element 40 of FIG. 1, and the optical element 140 has another prism portion 147 at the lower end portion thereof. More specifically, this prism portion 147 has a reflection surface 148 inclined at an angle of 45° with respect to the axis of the optical element 140, and a flat light receiving surface 141 parallel to the axis of the optical element 140. The light receiving surface 141 is disposed in opposed relation to the collimating lens 30.

A notch 119a is formed in the upper edge portion of the auxiliary through hole 119, and a cover 50 is fixed at its peripheral edge portion to the notch 119a. Windows 110a and 117a are formed in the casing 110 and the second support tube 117, respectively.

In the light emitting device of FIG. 6, a parallel beam from the collimating lens 30 is incident on the light receiving surface (incident surface) 141 of the optical element 140, and is reflected by the reflection surface 148, and advances upward along the axis of the optical element 140, and is reflected by the reflection surface 142 to be directed toward the cylindrical lens portion 146, so that the reflected beam is converted by the cylindrical lens portion 146 into a beam diverging into a fan-shape, and this diverging beam is emitted from the casing 110 through the windows 117a and 110a. In this light emitting device, the optical axes of the semiconductor laser element 20 and the collimating lens 30 are disposed perpendicular to the axis of the optical element 140, and the semiconductor laser element 20 and the collimating lens 30 are positioned on the side of the optical element 140. With this arrangement, the dimension H between the upper and lower flat surfaces 110x and 110y of the casing 110, and hence the height of the casing 110 from the surface A can be reduced. In FIG. 6, the prism portion 147 may be separate from the remainder of the optical element 140, and may be bonded thereto.

Figure 7:
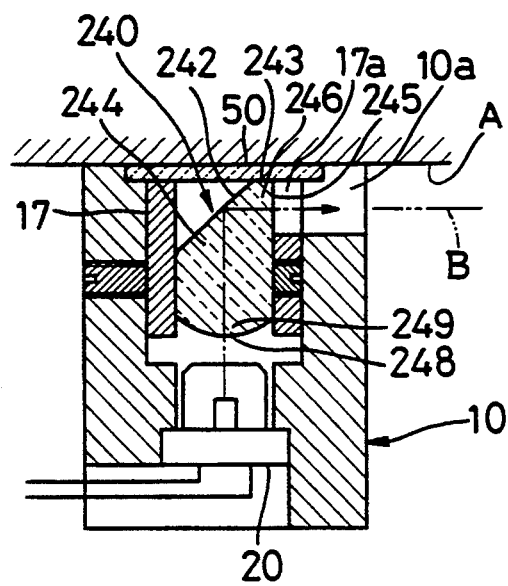
Figure 8:
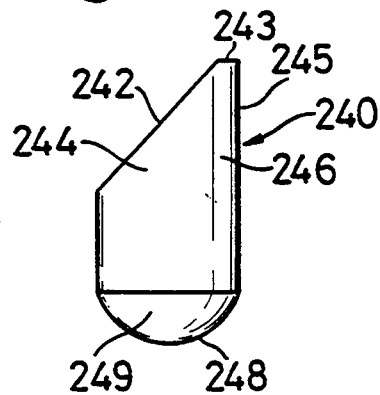
FIG. 8 is a side-elevational view of an optical element used in the light emitting device of FIG. 7.
Figure 9:
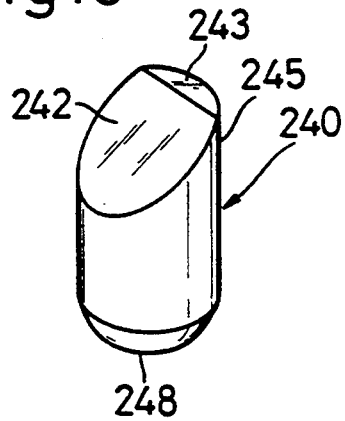
FIG. 9 is a perspective view of the optical element of FIG. 8.

A light emitting device shown in FIG. 7 does not use the separate collimating lens 30 and the support tube 15 (which supports the lens 30) as used in the light emitting device of FIG. 1. As best shown in FIGS. 8 and 9, an optical element 240, like the optical element 40 of FIG. 1, has a generally cylindrical shape, and has at its upper end portion a prism portion 244 having a reflection surface 242, a cylindrical lens portion 246 having a cylindrical surface 245, and a flat surface 243. The optical element 240 differs from the optical element 40 in the following respects. A lower end surface 248 of the optical element 240 is convex or semi-spherical, and the lower end portion of the optical element 240 including this convex surface 248 serves as a collimating lens portion 249. The optical axis of the collimating lens portion 249 is aligned with the axis of the optical element 240 and an optical axis of a semiconductor laser element 20. This light emitting device has a further reduced number of the component parts, and therefore can be simplified in construction and be of a compact size.

In the light emitting device of FIG. 7, a conically-diverging beam from the semiconductor laser element 20 is refracted by the convex surface 248 of the optical element 240 to be converted into a parallel beam, and advances upward along the axis of the optical element 240.

Figure 10:
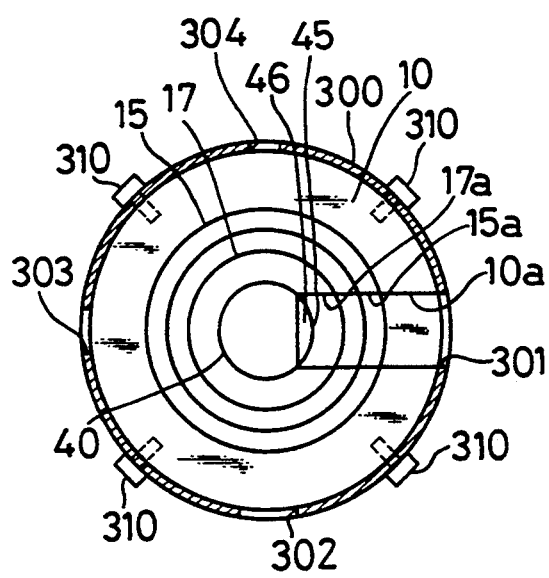
FIGS. 10 and 11 are plan views of further modified light emitting devices with a cover, respectively.

In an embodiment shown in FIG. 10, a cylindrical cover 300 is mounted on an outer periphery of a cylindrical casing 10. The cover 300 is fixedly secured to the casing 10 by four screws 310. More specifically, four through holes (not shown) are formed through the cover 300, and are spaced at equal intervals in its circumferential direction. Four screw holes (not shown) are formed in the outer periphery of the casing 10, and are spaced at equal intervals in its circumferential direction. The cover 300 is fixedly secured to the casing 10 by the four screws 310 each passing through the corresponding through hole and threaded into the corresponding screw hole. The cover 300 has four windows 301 to 304 spaced at equal intervals in its circumferential direction. The widths of the windows 301 to 304 in the circumferential direction of the cover 300 are different from one another, and any of these four windows is equal to or smaller in width than a window 10a of the casing 10. One of the windows 301 to 304 is selected, and is disposed in registry with the window 10a of the casing 10. The angle of divergence of the beam from a cylindrical lens portion 46 of an optical element 40 is determined by the width of this selected window in the circumferential direction of the cover 300. Therefore, the angle of divergence of the beam can be adjusted in four steps.

Figure 11:
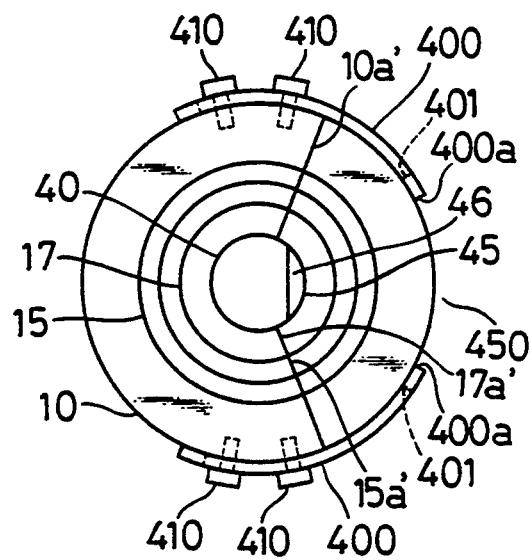

A light emitting device shown in FIG. 11 has a pair of covers 400 of an arcuate shape extending along an outer peripheral surface of a casing 10. Each cover 400 has a slot 401 extending in its peripheral direction. Each cover 400 is fixed to the casing 10 by screws 410 passing through the slot 401 and threaded into respective screw holes (not shown) formed in the outer peripheral surface of the casing 10. By loosening the screws 410, the cover 400 can be moved relative to the casing 10 in the circumferential direction of the casing 10. The circumferential widths of windows 10a', 15a' and 17a' of the casing 10 and support tubes 15 and 17 are greater than those of the windows 10a, 15a and 17a of FIG. 10, respectively.

In the light emitting device of FIG. 11, opposed edges 400a of the pair of covers 400 forms a window 450 for passing the beam from a cylindrical lens portion 46 of an optical element 40 therethrough. By adjusting the positions of the pair of covers 400 in the circumferential direction of the casing 10, the width of the window 450 in this circumferential direction can be adjusted in a stepless manner, and therefore the angle of divergence of the beam from the cylindrical lens portion 46 can be adjusted in a stepless manner.

The present invention is not limited to the above embodiments, and various modifications can be made. For example, the light source is not limited to the semiconductor, and can comprise a light-emitting diode, a gas laser, or an end of an optical fiber. The collimating lens, instead of providing the parallel beam, may converge the light into a point remote from the collimating lens. The light emitting devices of the present invention may be used to detect a projection on a surface.

What is claimed is:

1. A device for emitting light diverging along an imaginary plane, comprising:
   (a) a casing:
   (b) a light source mounted within said casing;
   (c) collimating lens means mounted within said casing so as to convert light from said light source into a generally parallel beam; and
   (d) a transparent optical element of a generally cylindrical shape mounted within said casing, said optical element having a first reflection surface and a cylindrical surface at one end portion thereof disposed near one end of said casing, said first reflection surface being inclined with respect to an axis of said optical element, said cylindrical surface extending along the axis of said optical element, that portion of said optical element including said cylindrical surface serving as a cylindrical lens portion, wherein the beam from said collimating lens means advances along the axis of said optical element, and is reflected by said first reflection surface to be directed toward said cylindrical lens portion, and said reflected beam is converted by said cylindrical lens portion into a beam diverging along the imaginary plane disposed generally perpendicular to the axis of said optical element, and is emitted from said casing.

2. A device according to claim 1, in which said collimating lens means comprises a collimating lens separate from said optical element.

3. A device according to claim 2, in which said optical element is received in a support tube having an externally-threaded portion formed on an outer periphery of said support tube, said casing including a tubular portion having an internally-threaded portion formed on an inner periphery of said tubular portion, and said support tube being threaded into said tubular portion of said casing, so that the distance between said first reflection surface of said optical element and an end surface of said tubular portion of said casing can be adjusted.

4. A device according to claim 2, in which said optical element has at the other end portion thereof a flat incident surface disposed generally perpendicular to the axis of said optical element, the beam from said collimating lens being incident on said flat incident surface.

5. A device according to claim 4, in which the axis of said optical element is aligned with optical axes of said collimating lens and said light source.

6. A device according to claim 2, in which said optical element has at the other end portion thereof a second reflection surface inclined with respect to the axis of said optical element, and a flat incident surface parallel to the axis of said optical element, optical axes of said light source and said collimating lens being disposed perpendicular to the axis of said optical element, wherein the beam from said collimating lens is incident on said flat incident surface, and is reflected by said second reflection surface to be directed toward said first reflection surface along the axis of said optical element.

7. A device according to claim 1, in which said optical element has at the other end portion thereof a convex surface, that portion of said optical element including said convex surface serving as said collimating lens means.

8. A device according to claim 1, in which cover means for adjusting the angle of divergence of the beam from said cylindrical lens portion of said optical element is mounted on an outer surface of said casing.

9. A device according to claim 8, in which said casing has a cylindrical shape, said cover means comprising a cylindrical cover member which is mounted on the outer periphery of said casing in such a manner that the position of said cover member relative to said casing can be adjusted in a circumferential direction of said casing, a plurality of windows being formed through said cover member and being spaced from one another, the widths of said windows in the circumferential direction of said cover member being different from one another, a selected one of said windows being disposed in opposed relation to said cylindrical lens portion, and the angle of divergence of the beam from said cylindrical lens portion being determined by the width of said selected window.

10. A device according to claim 8, in which said casing has a cylindrical shape, said cover means comprising a pair of arcuate cover members which are mounted on the outer periphery of said casing in such a manner that the positions of said pair of cover members relative to said casing can be adjusted in a circumferential direction of said casing, opposed edges of said pair of cover members forming a window disposed in opposed relation to said cylindrical lens portion, and the angle of divergence of the beam from said cylindrical lens portion being determined by the circumferential width of said window.

11. A device for emitting light diverging along an imaginary plane, comprising:
 (a) a casing:
 (b) light emitting means mounted within said casing for emitting a generally parallel beam; and
 (c) a transparent optical element of a generally cylindrical shape mounted within said casing, said optical element having a reflection surface and a cylindrical surface at one end portion thereof disposed near one end of said casing, said reflection surface being inclined with respect to an axis of said optical element, said cylindrical surface extending along the axis of said optical element, that portion of said optical element including said cylindrical surface serving as a cylindrical lens portion, wherein the beam from said light emitting means advances along the axis of said optical element, and is reflected by said reflection surface to be directed toward said cylindrical lens portion, and said reflected beam is converted by said cylindrical lens portion into a beam diverging along the imaginary plane disposed generally perpendicular to the axis of said optical element, and is emitted from said casing.

* * * * *